(12) United States Patent
Sreeram et al.

(10) Patent No.: US 12,024,775 B2
(45) Date of Patent: *Jul. 2, 2024

(54) GAS DISTRIBUTION SYSTEM AND REACTOR SYSTEM INCLUDING SAME

(71) Applicant: ASM IP Holding B.V., Almere (NL)

(72) Inventors: Sonti Sreeram, Gilbert, AZ (US); Junwei Su, Tempe, AZ (US); Loc Vinh Tran, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/207,322

(22) Filed: Jun. 8, 2023

(65) Prior Publication Data
US 2023/0313377 A1   Oct. 5, 2023

Related U.S. Application Data

(63) Continuation of application No. 15/997,445, filed on Jun. 4, 2018, now Pat. No. 11,718,913.

(51) Int. Cl.
*C23C 16/455* (2006.01)
*H01J 37/32* (2006.01)

(52) U.S. Cl.
CPC .. *C23C 16/45587* (2013.01); *C23C 16/45557* (2013.01); *C23C 16/45561* (2013.01); *C23C 16/45563* (2013.01); *H01J 37/32449* (2013.01); *H01J 37/32458* (2013.01)

(58) Field of Classification Search
CPC ........ C23C 16/45587; C23C 16/45557; C23C 16/45561; C23C 16/45563; H01J 37/32449; H01J 37/32458
USPC .......................................................... 118/715
See application file for complete search history.

(56) References Cited

U.S. PATENT DOCUMENTS

| | | | | |
|---|---|---|---|---|
| 4,393,013 A | * | 7/1983 | McMenamin | C30B 25/14 137/101.25 |
| 4,725,204 A | * | 2/1988 | Powell | C23C 16/4412 417/205 |
| 5,653,807 A | * | 8/1997 | Crumbaker | C30B 29/52 204/298.07 |
| 5,683,561 A | * | 11/1997 | Hollars | C23C 14/568 204/298.25 |
| 6,296,711 B1 | | 10/2001 | Loan et al. | |
| 6,302,139 B1 | | 10/2001 | Dietz | |
| 2002/0092281 A1 | * | 7/2002 | Choi | C23C 16/45561 55/420 |
| 2003/0134038 A1 | | 7/2003 | Paranjpe | |
| 2003/0180458 A1 | | 9/2003 | Sneh | |

(Continued)

FOREIGN PATENT DOCUMENTS

JP   S6222420 A   1/1987
JP   H06163425 A   6/1994

(Continued)

*Primary Examiner* — Charlee J. C. Bennett
(74) *Attorney, Agent, or Firm* — Snell & Wilmer L.L.P.

(57) ABSTRACT

A gas distribution system, a reactor system including the gas distribution system, and method of using the gas distribution system and reactor system are disclosed. The gas distribution system can be used in gas-phase reactor systems to independently monitor and control gas flow rates in a plurality of channels of a gas distribution system coupled to a reaction chamber.

20 Claims, 8 Drawing Sheets

(56) References Cited

U.S. PATENT DOCUMENTS

| | | | |
|---|---|---|---|
| 2004/0118342 A1* | 6/2004 | Cheng | C23C 16/455 118/715 |
| 2005/0120955 A1 | 6/2005 | Yamasaki et al. | |
| 2005/0145181 A1 | 7/2005 | Dickinson | |
| 2005/0173003 A1* | 8/2005 | Laverdiere | G05D 16/2013 137/487.5 |
| 2007/0251452 A1 | 11/2007 | Tanaka et al. | |
| 2009/0208725 A1* | 8/2009 | Bailey | C23C 16/56 427/255.28 |
| 2012/0027955 A1 | 2/2012 | Sunkara et al. | |
| 2012/0031500 A1 | 2/2012 | Hirose et al. | |
| 2013/0029496 A1 | 1/2013 | Bauer et al. | |
| 2013/0092269 A1 | 4/2013 | Nakada et al. | |
| 2014/0020764 A1 | 1/2014 | Woelk et al. | |
| 2014/0060430 A1 | 3/2014 | Oosterlaken et al. | |
| 2014/0182689 A1* | 7/2014 | Shareef | G05D 11/132 137/455 |
| 2015/0221508 A1* | 8/2015 | Kurita | H01L 21/02554 118/723 R |
| 2015/0267297 A1* | 9/2015 | Shiba | C23C 16/45536 427/595 |
| 2015/0267299 A1* | 9/2015 | Hawkins | C23C 16/45523 427/255.28 |
| 2019/0112707 A1* | 4/2019 | Liu | C23C 16/45527 |

FOREIGN PATENT DOCUMENTS

| | | |
|---|---|---|
| JP | H0758044 A | 3/1995 |
| JP | 2007214406 A | 8/2007 |
| JP | 2009283715 A | 12/2009 |

* cited by examiner

GAS DISTRIBUTION SYSTEM AND REACTOR SYSTEM INCLUDING SAME

CROSS-REFERENCE TO RELATED APPLICATIONS

This application is a continuation of, and claims priority to and the benefit of, U.S. patent application Ser. No. 15/997,445, filed Jun. 4, 2018 and entitled "GAS DISTRIBUTION SYSTEM AND REACTOR SYSTEM INCLUDING SAME," which is hereby incorporated by reference herein.

FIELD OF THE DISCLOSURE

The present disclosure generally relates to gas-phase reactors and systems. More particularly, the disclosure relates to gas distribution systems for gas-phase reactors, to reactor systems including a gas distribution system, and to methods of using the gas distribution systems and reactor systems.

BACKGROUND OF THE DISCLOSURE

Gas-phase reactors, such as chemical vapor deposition (CVD), plasma-enhanced CVD (PECVD), atomic layer deposition (ALD), and the like, can be used for a variety of applications, including depositing and etching materials on a substrate surface. For example, gas-phase reactors can be used to deposit and/or etch layers on a substrate to form semiconductor devices, flat panel display devices, photovoltaic devices, microelectromechanical systems (MEMS), and the like.

A typical gas-phase reactor system includes a reactor including a reaction chamber, one or more precursor gas sources fluidly coupled to the reaction chamber, one or more carrier and/or purge gas sources fluidly coupled to the reaction chamber, a gas distribution system to deliver gases (e.g., the precursor gas(es) and/or carrier or purge gas(es)) to the reaction chamber, and an exhaust source fluidly coupled to the reaction chamber.

Generally, it is desirable to have uniform film properties (e.g., film thickness and resistivity) across a surface of a substrate and/or to have control over any desired variation. Various gas distribution systems have been developed to attempt to achieve uniform or controllable film properties. For example, gas distribution systems including multiple ports (e.g., 5) or nozzles located within the reaction chamber have been developed to increase uniformity of film properties across a substrate surface. In such examples, a flow rate to each channel can be adjusted using a needle valve. Although this technique works well for some applications, such systems may not adequately address desired uniformity and/or controllability of film properties, particularly at or near an edge of a substrate. Additionally, use of the needle valve may generate undesired particles—e.g., due to mechanical abrasion of valve components. Further, flow of one or more precursors may be relatively unstable, particularly when switching between gases.

As sizes of features formed on a substrate surface decrease, it becomes increasingly important to control film properties, such as film thickness and resistivity. Moreover, it may be desirable to independently tune film properties; e.g., to independently tune film thickness uniformity and/or resistivity in layers deposited using gas-phase reactors, such as epitaxial layers grown using such reactors. Accordingly improved gas distribution systems, reactor systems including an improved gas distribution system, and methods of using the gas distribution and reactor systems are desired.

SUMMARY OF THE DISCLOSURE

Various embodiments of the present disclosure relate to gas distribution systems, reactor systems including a gas distribution system, and to methods of using the gas distribution and reactor systems. While the ways in which various embodiments of the present disclosure address drawbacks of prior gas distribution systems and reactor systems are discussed in more detail below, in general, various embodiments of the disclosure provide gas distribution systems that can provide improved control of gas flow rates to individual channels of a gas distribution system, provide dynamic feedback of flow and/or flow ratios of gas to one or more channels of a gas distribution system, and/or provide improved stability of flow rates and/or flow ratios of gas in each channel of a gas distribution system. Further, exemplary systems and methods allow fine tuning of reactants provided to a reaction chamber and/or a substrate surface. In addition, exemplary gas distribution systems allow for independent tuning of film properties, such as film thickness, film thickness uniformity, and film resistivity.

In accordance with exemplary embodiments of the disclosure, a gas distribution system includes a first gas supply line; a first gas manifold coupled to the first gas supply line, wherein the first gas manifold comprises a plurality of first gas outlets; a plurality of first gas flow sensors, wherein at least one of the plurality of first gas flow sensors is coupled to each of the plurality of first gas outlets; a plurality of first gas valves, wherein at least one of the plurality of first gas valves is coupled to an outlet of each of the plurality of first gas flow sensors; and a first gas pressure-controlled vent line selectively coupled to each of the plurality of first gas valves. Exemplary gas distribution systems can also include a second gas supply line; a second gas manifold coupled to the second gas supply line, wherein the second gas manifold comprises a plurality of second gas outlets; a plurality of second gas flow sensors, wherein at least one of the plurality of second gas flow sensors is coupled to each of the plurality of second gas outlets; a plurality of second gas valves, wherein at least one of the plurality of second gas valves is coupled to an outlet of each of the plurality of second gas flow sensors; and a second gas pressure-controlled vent line selectively coupled to each of the plurality of first gas valves. Gas distribution systems in accordance with the present disclosure can similarly include three of more gas lines and the corresponding components, as described in connection with the first and second gas lines. In accordance with exemplary expects of the embodiments, the gas distribution system includes a plurality of first and/or second gas selection valves, wherein an inlet of each of the plurality of first and/or second gas selection valves is respectively coupled to an outlet one of the first or second gas valves and an outlet of each of the plurality of first and/or second gas selection valves is respectively coupled to an inlet of the first or second gas pressure-controlled vent line. The first and/or second gas selection valves can also be selectively coupled to a reaction chamber. This configuration allows fast switching between gases (e.g., precursor gases), and facilitates controlled flow of the gases into the reaction chamber and onto the substrate surface. Use of the flow controllers as described herein can allow independent control of gas flow rates to one or more channels (described in more detail below) of a gas distribution system, which in turn, can allow for fine tuning of various properties of films deposited using such systems and/or reactant concertation profiles within a reaction chamber.

In accordance with additional exemplary embodiments of the disclosure, a gas-phase reactor system includes one or more gas distribution systems as described herein. The exemplary systems can also include an exhaust (e.g., vacuum) source coupled to the reaction chamber, a first gas source fluidly coupled to the one or more first gas channels, and a second gas source fluidly coupled to the one or more second gas channels. Systems can include additional gas and/or exhaust sources.

In accordance with yet additional exemplary embodiments of the disclosure, a method of providing gas-phase reactants to a surface of a substrate includes the steps of providing a gas-phase reactor system, providing a gas distribution system as described herein, providing a substrate within the reaction chamber, and exposing the substrate to a first gas from the first gas source and a second gas from the second gas source. Exemplary methods can further include manipulating one or more valves coupled to the one or more first gas channels and/or manipulating one or more control valves coupled to the one or more second gas channels. Exemplary methods can also include a step of providing an asymmetric setting of one or more of a first gas from the first gas source and a second gas from the second gas source—to, e.g., tune (e.g., independently) film properties, such as film thickness, film thickness uniformity, and film resistivity across a surface of a substrate, including an edge region of the substrate, or the like.

BRIEF DESCRIPTION OF THE DRAWING FIGURES

A more complete understanding of exemplary embodiments of the present disclosure can be derived by referring to the detailed description and claims when considered in connection with the following illustrative figures.

FIG. 1 illustrates a reactor system in accordance with at least one exemplary embodiment of the present disclosure.

FIG. 2 schematically illustrates a gas distribution system in accordance with at least one exemplary embodiments of the disclosure.

Figure 1:
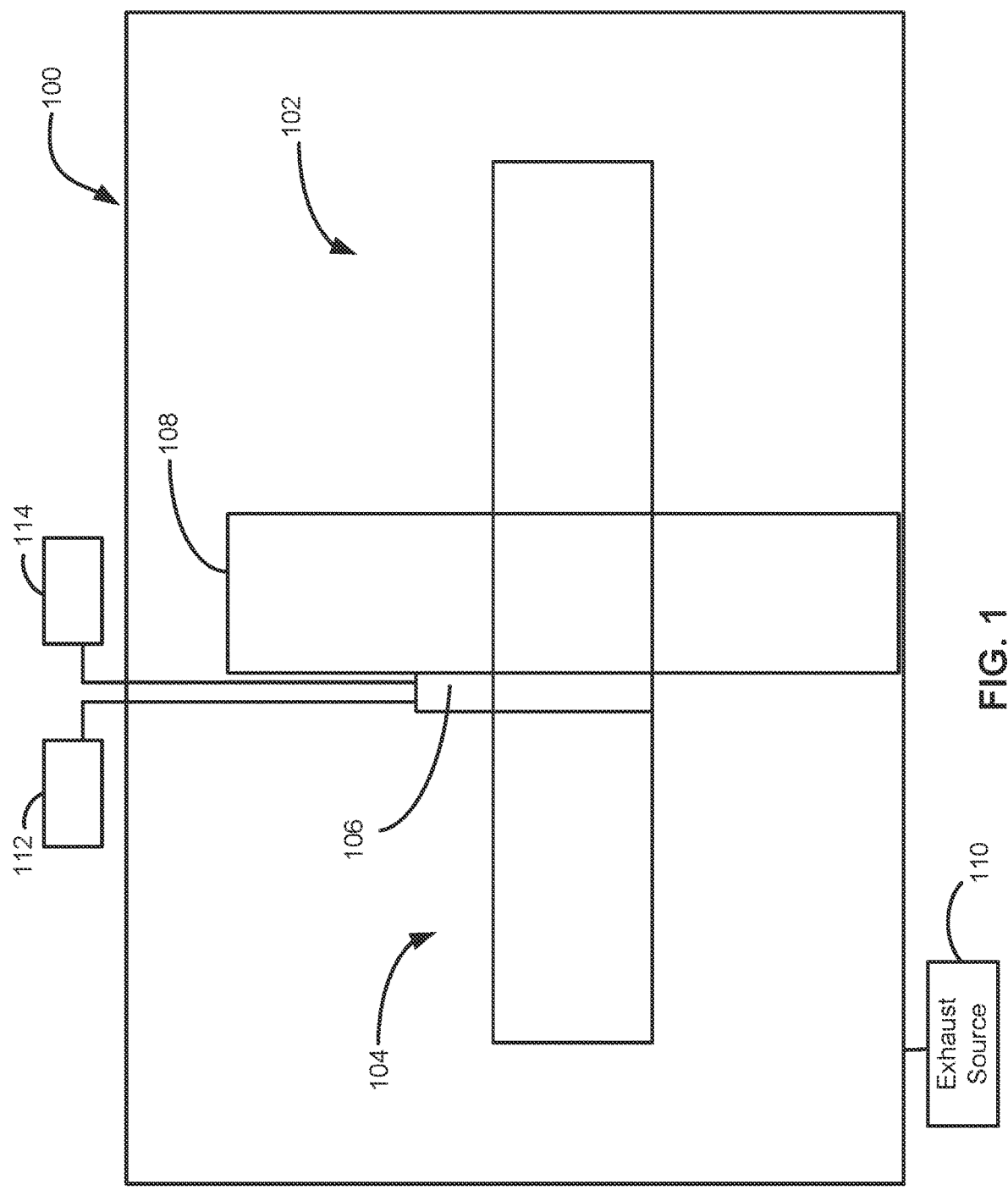

It will be appreciated that elements in the figures are illustrated for simplicity and clarity and have not necessarily been drawn to scale. For example, the dimensions of some of the elements in the figures may be exaggerated relative to other elements to help to improve the understanding of illustrated embodiments of the present disclosure.

DETAILED DESCRIPTION OF EXEMPLARY EMBODIMENTS OF THE DISCLOSURE

The description of exemplary embodiments provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

The present disclosure generally relates to gas distribution systems, to reactor systems including a gas distribution system, and to methods of using the gas distribution systems and reactor systems. Gas distribution systems and reactor systems including a gas distribution system as described herein can be used to process substrates, such as semiconductor wafers, in gas-phase reactors. By way of examples, the systems described herein can be used to form or grow epitaxial layers (e.g., two component and/or doped semiconductor layers) on a surface of a substrate.

As used herein, a "substrate" refers to any material having a surface onto which material can be deposited. A substrate may include a bulk material such as silicon (e.g., single crystal silicon) or may include one or more layers overlying the bulk material. Further, the substrate may include various topologies, such as trenches, vias, lines, and the like formed within or on at least a portion of a layer of the substrate.

As set forth in more detail below, use of exemplary gas distribution systems as described herein is advantageous, because it allows independent metering and control of gas flow rates to various input cites (e.g., to multiple inlet locations within a flange, described in more detail below) of a reaction chamber. The independent control of gases and flow rates can, in turn, allow independent tuning of film properties of films that are formed using a reactor system including the gas distribution system. For example, an exemplary gas distribution system can be used to independently tune resistivity and film thickness (or thickness uniformity) of, for example, epitaxially formed layers on a substrate. Additionally or alternatively, exemplary gas distribution systems can be used to compensate for gas flow variations, depletion rate variations, auto doping, or combinations thereof that otherwise occur within a reaction chamber of a reactor system. For example, the independent control of various gases can be used to compensate for edge effects and/or a rotating substrate, that might otherwise cause nonuniformity in one or more film properties. Further, exemplary gas distribution systems can provide real-time feedback of gas flow rates in each gas channel. Exemplary gas distribution systems are scalable to any desired number of gas channels. Additionally, exemplary gas distribution systems of the present disclosure can be used for relatively high gas flow rates (e.g., greater than 2 SLM of nitrogen through each channel) and/or can operate at relatively high (e.g., near atmospheric) pressures, if desired. Additionally, exemplary gas distribution systems can provide relatively stable flowrates, even when switching gases provided to a reactor. Further, as discussed in greater detail below, exemplary systems can reduce memory effect associated with large volumes of gas(es) in the feed line as the gas(es) enter the reaction chamber. These and other features of the systems and methods described herein can be particularly useful in depositing high-quality interface layers on substrates, while minimizing defects that might otherwise form due to, for example, residual gas(es) in the dead volumes of the feed lines.

Turning now to the figures, FIG. 1 illustrates an exemplary reactor system 100. Reactor system 100 can be used for a variety of applications, such as, for example, chemical vapor deposition (CVD), plasma-enhanced CVD (PECVD), atomic layer deposition (ALD), clean processes, etch processes, and the like. Although exemplary embodiments are described below in connection with epitaxial reactor systems, the embodiments and the invention are not so limited, unless stated otherwise.

In the illustrated example, reactor system 100 includes an optional substrate handling system 102, a reaction chamber 104, a gas distribution system 106, and optionally a wall 108 disposed between reaction chamber 104 and substrate handling system 102. System 100 can also include a first gas source 112, a second gas source 114, and an exhaust source 110. Although illustrated with two gas sources 112, 114, reactor system 100 can include any suitable number of gas sources. Gas sources 112, 114 can include, for example, a precursor gas, such as trichlorosilane, dichlorosilane, silane, disilane, and trisilane; a dopant source, such as a gas comprising As, P, C, Ge, and B; and mixtures of gases, including mixtures of gases with a carrier gas, such as hydrogen, nitrogen, argon, or the like. Additionally or alternatively, one of first gas source 112 and second gas source 114 can include an etchant, such as hydrogen chloride. By way of examples, exemplary reactor systems can include at least two precursor gas sources and optionally one or more carrier and/or purge gas sources. Reactor system 100 can include any suitable number of reaction chambers 104 and substrate handling systems 102. By way of example, reaction chamber 104 of reactor system 100 includes a cross flow, cold wall epitaxial reaction chamber. An exemplary reactor system including a horizontal flow reactor available as a system from ASM.

During operation of reactor system 100, substrates, such as semiconductor wafers, (not illustrated) are transferred from, e.g., substrate handling system 102, to reaction chamber 104. Once substrate(s) are transferred to reaction chamber 104, one or more gases from gas sources 112, 114, such as precursors, dopants, carrier gases, and/or purge gases are introduced into reaction chamber 104 via gas distribution system 106. As set forth in more detail below, gas distribution system 106 can be used to meter and control gas flow rates of one or more gases from first gas source 112 and second gas source 114 during substrate processing.

Figure 2:
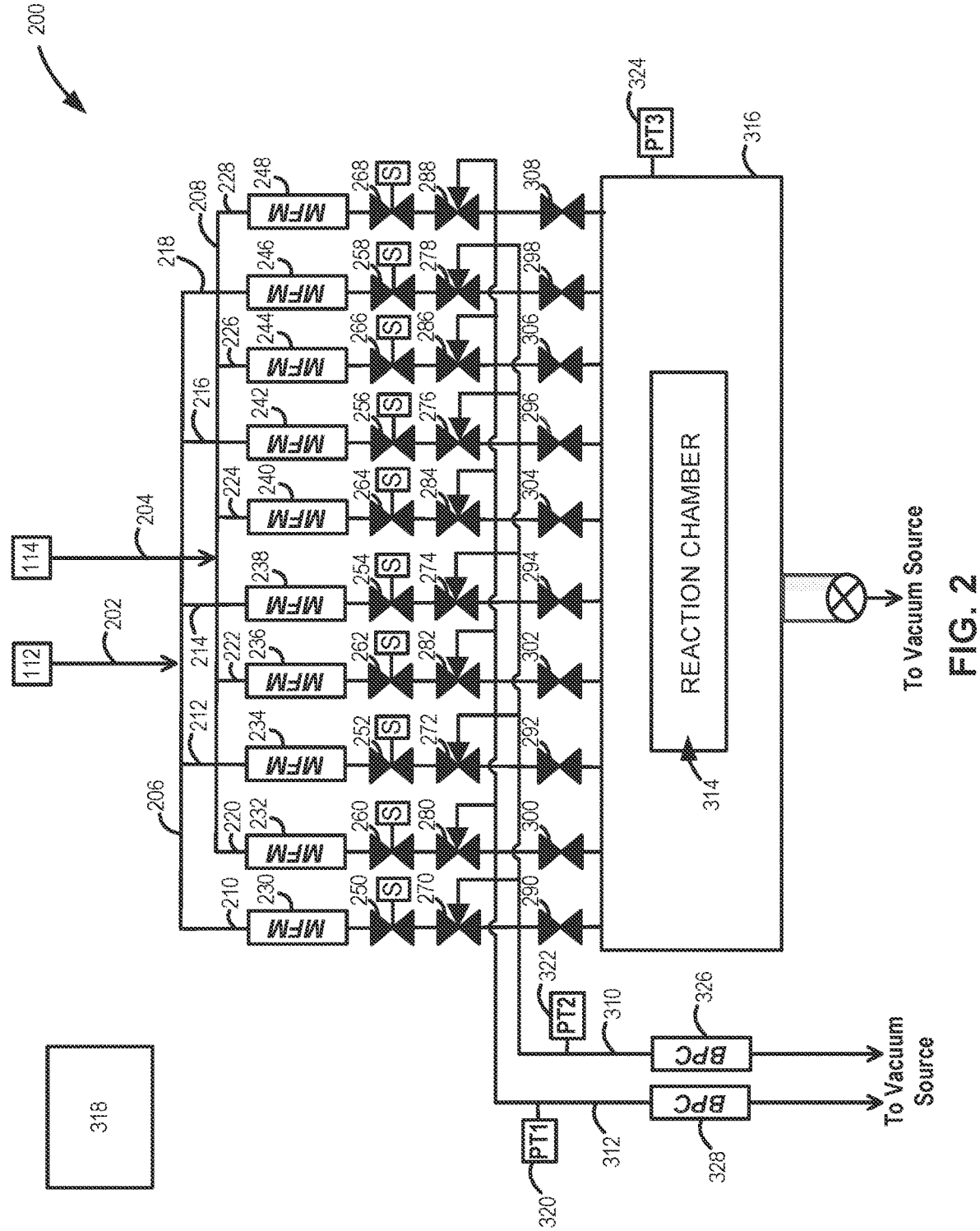
Figure 3:
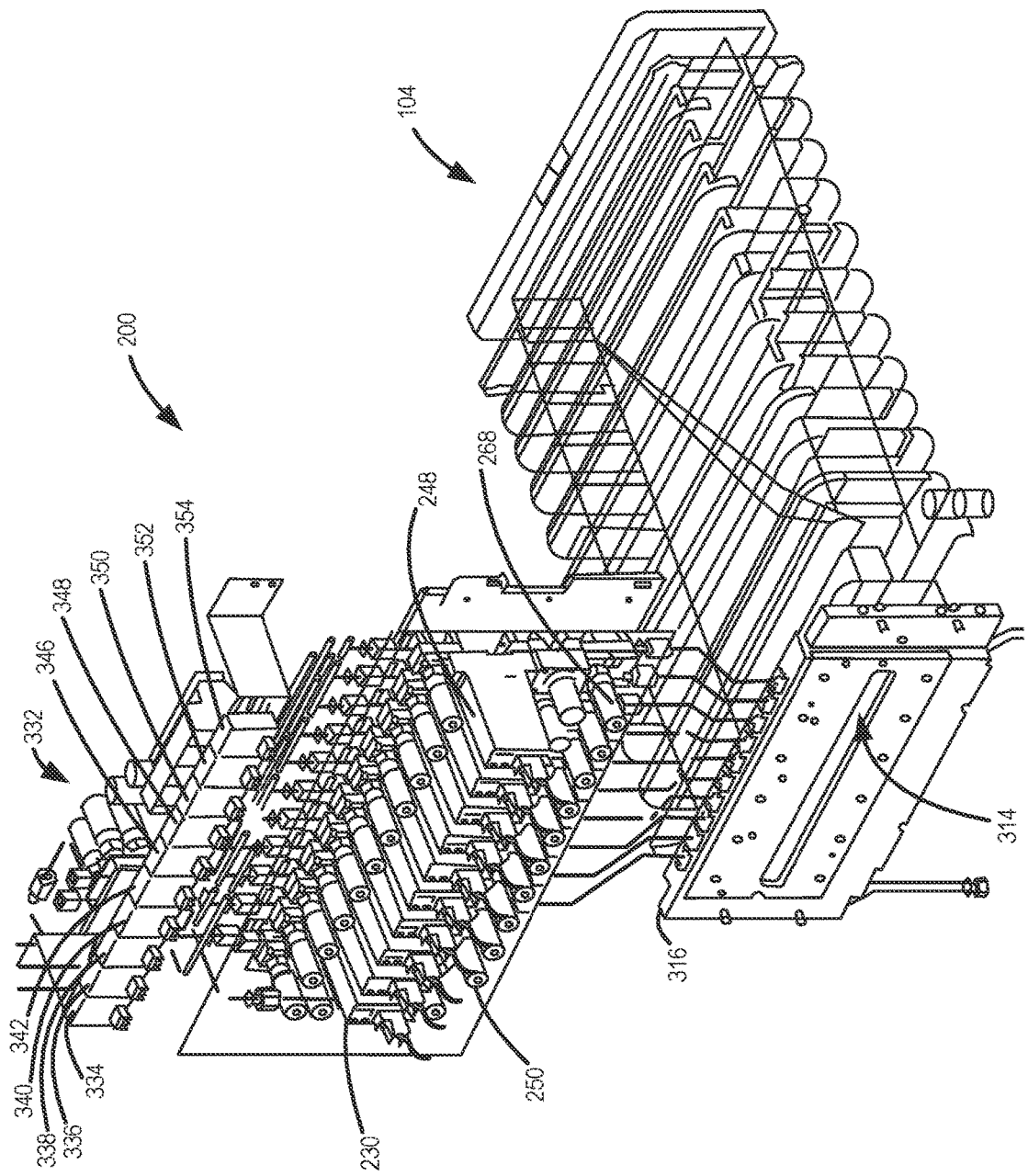
FIGS. 3, 4 and 5 illustrate views of a gas distribution system in accordance with at least one exemplary embodiments of the disclosure.
Figure 4:
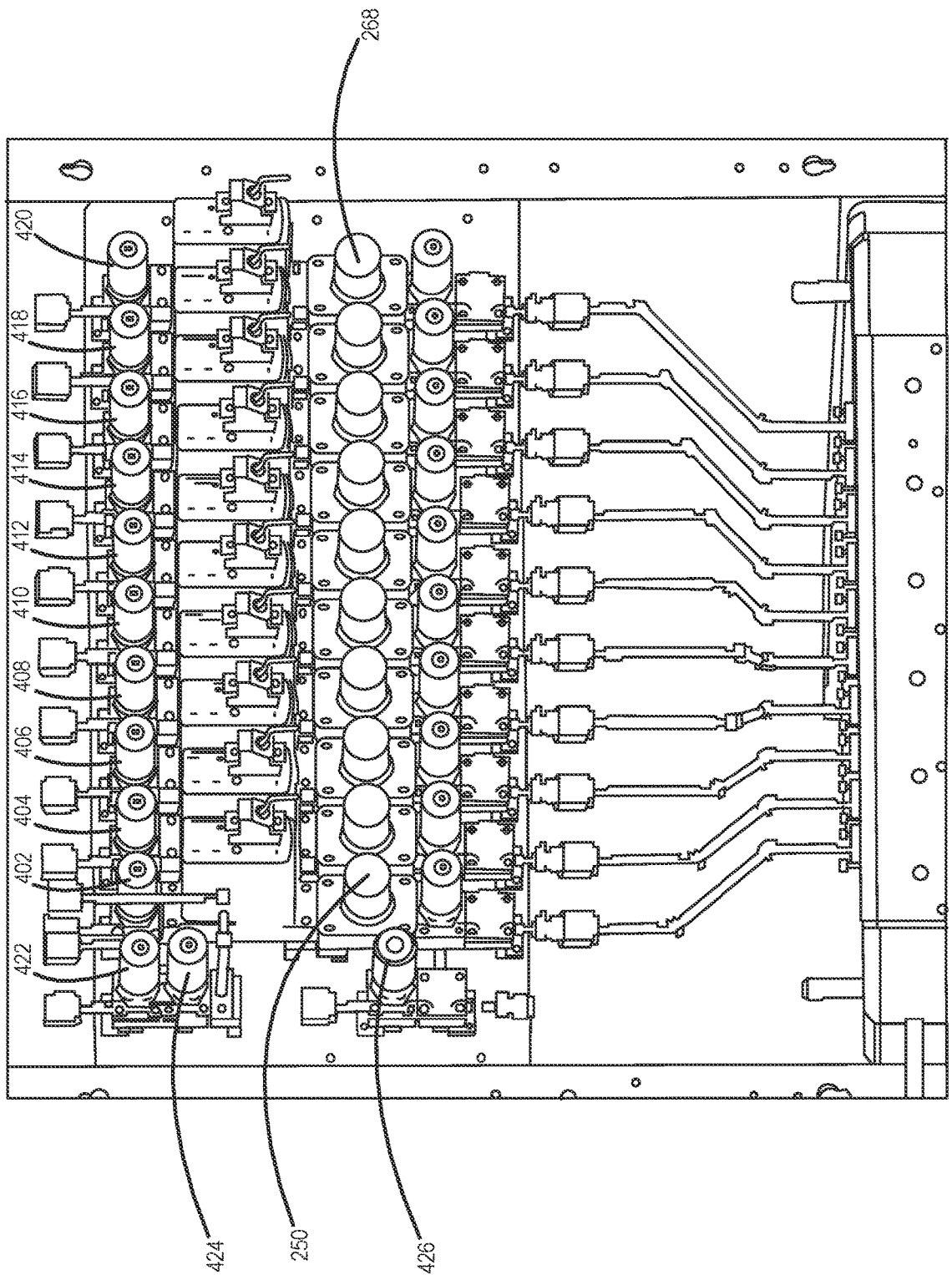
Figure 5:
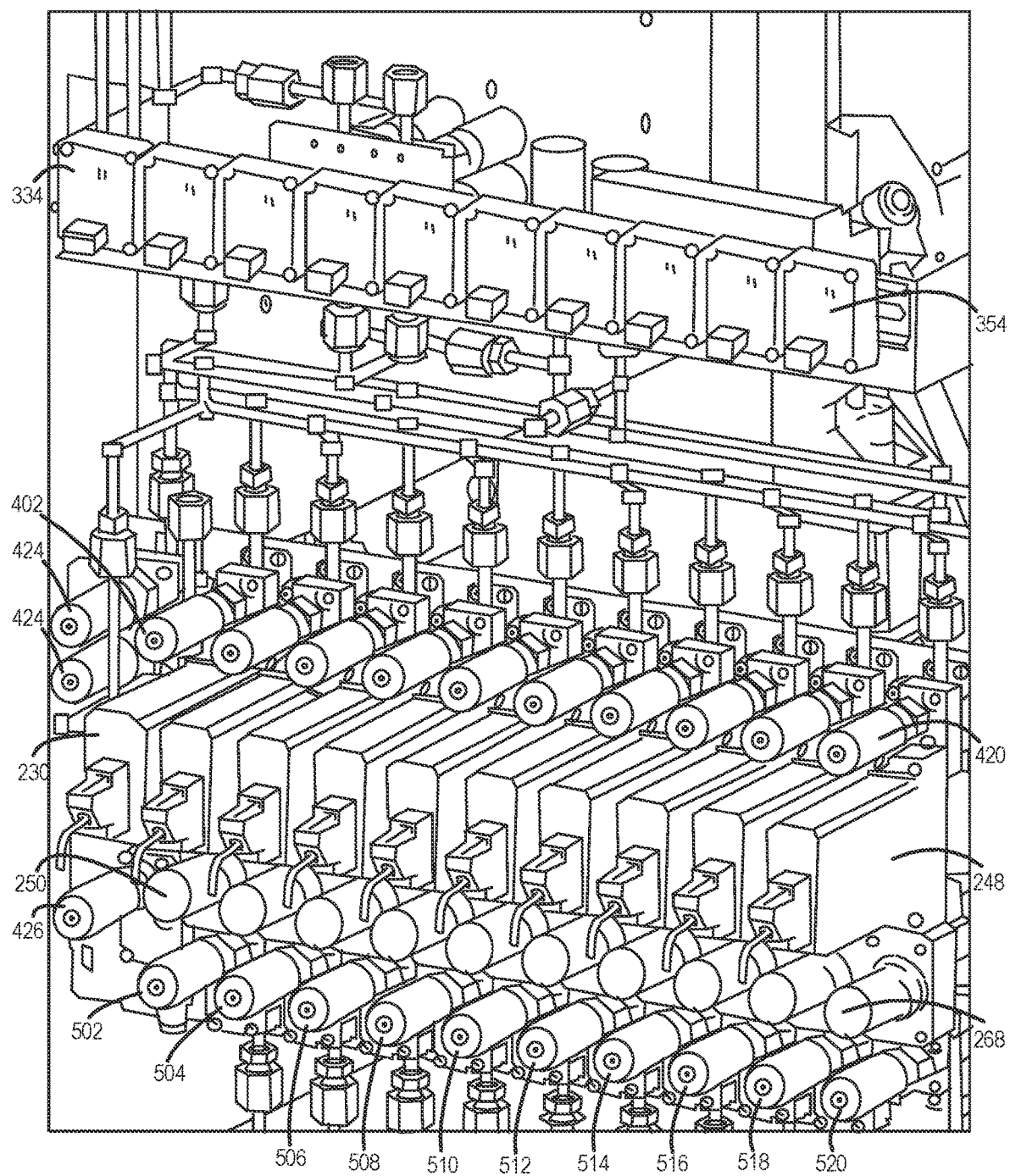

FIG. 2 schematically illustrates and FIGS. 3-5 further illustrate a gas distribution system 200, suitable for use as gas distribution 106, in accordance with exemplary embodiments of the disclosure. Gas distribution system 200 includes a first gas supply line 202 coupled to first gas source 112 and a second gas supply line 204 coupled to second gas source 114. When referring to gas lines and components of gas distribution system 200, the term "coupled" refers to fluidly coupled, and, unless stated otherwise, the lines or components need not be directly fluidly coupled, but rather gas distribution system 200 could include other intervening elements, such as valves, meters, or the like.

With continued reference to FIGS. 2-5, gas distribution system 200 includes a first gas manifold 206 coupled to first gas supply line 202 and a second gas manifold 208 coupled to second gas supply line 204. First gas manifold 206 includes a plurality of first gas outlets 210-218. Similarly, second gas manifold 208 includes a plurality of second gas outlets 220-228. First gas manifold 206 and second gas manifold 208 are configured to receive gas from one or more gas lines (e.g., first and second gas lines 202, 204) and distribute the gas into one or more channels, which are respectively defined, in part, by first gas outlets 208-218 and second gas outlets 220-228. In the illustrated example, each of the each of the first and second gas streams are divided into five gas channels. Although illustrated with five of each of first gas outlets 208-218 and second gas outlets 220-228, gas distribution systems in accordance with this disclosure can include any suitable number of first, second, and/or other gas outlets, corresponding to a number of channels for the respective gases.

Gas distribution system 200 includes a plurality of flow sensors 230-248 coupled to first and second gas outlets 210-228. In the illustrated example, each first and second gas outlets 210-228 is coupled to a single flow sensor 230-248. However, in some cases, it may be desirable to have some gas outlets that are not coupled to a flow sensor and/or to have some gas outlets that are coupled to more than one flow sensor. Flow sensors 230-248 can be used to provide real-time and/or historical flow rate information to a user, for each channel—e.g., using a graphical user interface. Additionally or alternatively, flow sensors 230-248 can be coupled to a controller (e.g., controller 318) and to first gas valves 250-258 and second gas valves 260-268 to provide controlled flowrate of the gases through the valves. Although illustrated as upstream of valves 250-268, flow sensors 230-248 can additionally or alternatively be located downstream of valves 250-268. Exemplary flow sensors 230-248 are mass flow meters. By placing flow sensors in each gas channel, the flowrate of gas through each channel can be independently measured and controlled, regardless of the gas composition.

First gas valves 250-258 and second gas valves 260-268 can include any suitable device to meter flow of a gas. In accordance with various embodiments of the disclosure, first gas valves 250-258 and second gas valves 260-268 each comprise proportional valves, such as solenoid valves, such as those available from Brooks Instruments. As illustrated in FIGS. 3 and 5, gas distribution system 200 can include a plurality of drivers 334-354 to manipulate each of first gas valves 250-258 and second gas valves 260-268 to a desired position—e.g., to control a flowrate in each of the channels. In accordance with further exemplary embodiments of the disclosure, gas distribution system 200 includes a plurality of first gas selection valves 270-278 and 290-298 and a plurality of second gas selection valves 280-288 and 300-308. First gas selection valves 270-278 and 290-298 and second gas selection valves 280-288 and 300-308 can be used to switch a flow of a gas from first gas source 112 (e.g., a total flow of gas through each gas channel) between a vent line 310, such as a pressure-controlled vent line, and a reaction chamber 314. Similarly, second gas selection valves 280-288 and 300-308 can be used to switch a flow of a gas from second gas source 114 (e.g., a total flow of gas through each gas channel) between a vent line 312 (e.g., a pressure-controlled vent line) and reaction chamber 314. In other words, gas from sources 112 and 114 can be continually flowing and switched between pressure controlled vent lines 310, 312 and reaction chamber 314. For example, prior to flowing a first gas from first gas source 112 to reaction chamber 314, first gas selection valves 270-278 can be open and first gas selection valves 290-298 can be closed to allow the first gas to flow from first gas source 112, though one or more, e.g., each first gas channel to first gas pressure-controlled vent line 310. Similarly, prior to flowing a second gas from second gas source 114 to reaction chamber 314, second gas selection valves 280-288 can be open and second gas selection valves 300-308 can be closed to allow the second gas to flow from second gas source 114, though one or more—e.g., each second gas channel, to second gas pressure-controlled vent line 312. In accordance with various embodiments of the disclosure, a pressure within first gas pressure-controlled vent line 310 and/or within second gas pressure-controlled vent line 312 can maintained at about (e.g., within ±10 percent, ±5 percent, ±2.5 percent, or ±1 percent of) the pressure within reaction chamber 314. This allows stabilized flowrate (e.g., less memory effect, smooth transitioning, and reduced effects from pressure perturbations that might otherwise exist) of gases when switching between gases (e.g., switching between precursors and/or between a precursor gas and a purge gas). Pressure transducers 320, 322 can be used to respectively measure a pressure within first gas pressure-controlled vent line 310 and second gas pressure-controlled vent line 312. Back pressure control valves 326, 328, can be coupled to pressure transducers 320, 322 to control the pressure within first gas pressure-controlled vent line 310 and second gas pressure-controlled vent line 312. Similarly, a pressure transducer 324 can be used to measure a pressure within reaction chamber 314 and can be used to control the pressure within reaction chamber 314 using controllable valve 328. Further, a pressure measured by pressure transducer 324 can be used to provide a set point to controller 318 as a pressure set point for first gas pressure-controlled vent line 310 and second gas pressure-controlled vent line 312. Unless otherwise noted, all of the controllable valves noted herein can be proportional valves, such as solenoid valves.

First gas selection valves 270-278 and 290-298 and second gas selection valves 280-288 and 300-308 can be coupled to reaction chamber 314 via a flange 316. First and second gas selection valves 270-308 can be surface mounted onto flange 316, or an additional line (e.g., tube) and suitable connectors can be used to couple the selection valves to flange 316. Exemplary flange 316 includes flange gas channels to maintain the channels until the respective gases exit into the reaction chamber. An exemplary flange suitable for use as flange 316 is disclosed in U.S. application Ser. No. 14/218,690, filed Mar. 18, 2014, and entitled GAS DISTRIBUTION SYSTEM, REACTOR INCLUDING THE SYSTEM, AND METHODS OF USING THE SAME, the contents of which are hereby incorporated herein by reference, to the extent such contents do not conflict with the present disclosure.

Gas distribution system 200 can optionally include a moisture sample panel 332 to inject moisture sense line. Moisture sample panel can include, for example, one or more pressure transducers, pneumatic valves, and/or restrictors. In the illustrated example, gas distribution system 200 also include isolation valves 402-420 to allow gas isolation to one or more channels—e.g., either during processing, if it is desired to not flow gas through a particular channel during process, or to allow maintenance of the system. Exemplary gas distribution system 200 can also include relief valves 422, 424 to allow venting of channels associated with the first gas and second gas, respectively. Additionally or alternatively, to facilitate purging of the channels and/or reaction chamber 314, gas distribution system 200 can include an inert gas (e.g., nitrogen) inlet valve 426 and channel purge valves 502-520.

Reaction chamber 314 can be formed of, for example, quartz. Exemplary operating pressures within reaction chamber 314 (and first and second gas vent lines) during switching and/or substrate processing can range from about 5 Torr to about 500 Torr. By way of examples, the pressure can range from about 2 mTorr to about 780 Torr.

Controller 318 can be configured to perform various functions and/or steps as described herein. Controller 318 can include one or microprocessors, memory elements, and/or switching elements to perform the various functions. Although illustrated as a single unit, controller 318 can alternatively comprise multiple devices. By way of examples, controller can be used to control flow of gas from first gas source 112 and second gas source 114. In particular, controller 318 can be configured to provide desired ratios of a total flow of a respective gas (e.g., from first gas source 112 or second gas source 114) in each of the channels. Additionally or alternatively, controller 318 can be used to stabilize gas flow rates as gas flows are introduced into a reaction chamber. In accordance with various examples of the disclosure, controller 318 includes a proportional-integral-derivative (PID) controller, which allows closed-loop control of the various controllable valves described herein, including first gas valves 250-258 and second gas valves 260-268. With PID closed-loop control, system 200 can dynamically adjust flows in one or more (e.g., all) gas channels to set points and/or provide stable, especially initial, flowrates of gases to reaction chamber 314 when switching between gas sources. By way of example, using PID control, an initial set point for each controlled valve can be selected. Flowrate feedback from and output each flow sensor coupled to the controllable valve can then be used in connection with a PID controller to control the desired set point (i.e., flowrate) of each of the controlled valves.

As noted above, valves described herein can include solenoid valves. Solenoid valves are known to exhibit hysteresis with regard to applied voltage. To compensate for this, in accordance with various examples of the disclosure, controller 318 is configured to apply sufficient voltage to fully open a valve and to then set the voltage at a desired level for the desired flowrate. This can also help mitigate drift of the valve settings.

Figure 6:
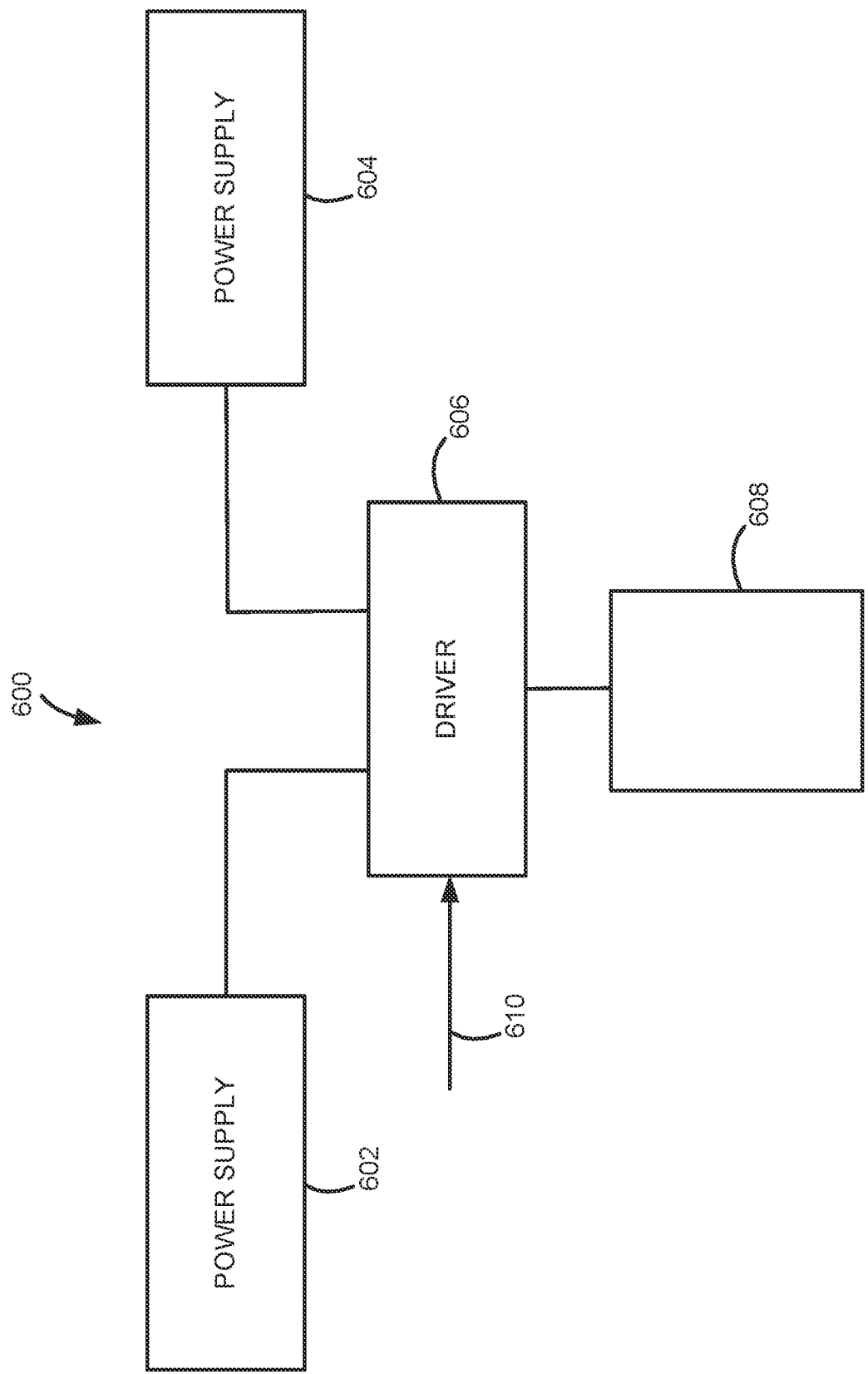
FIGS. 6, 7 and 8 illustrate a controller and driver in accordance with at least one embodiments of the disclosure.
Figure 7:
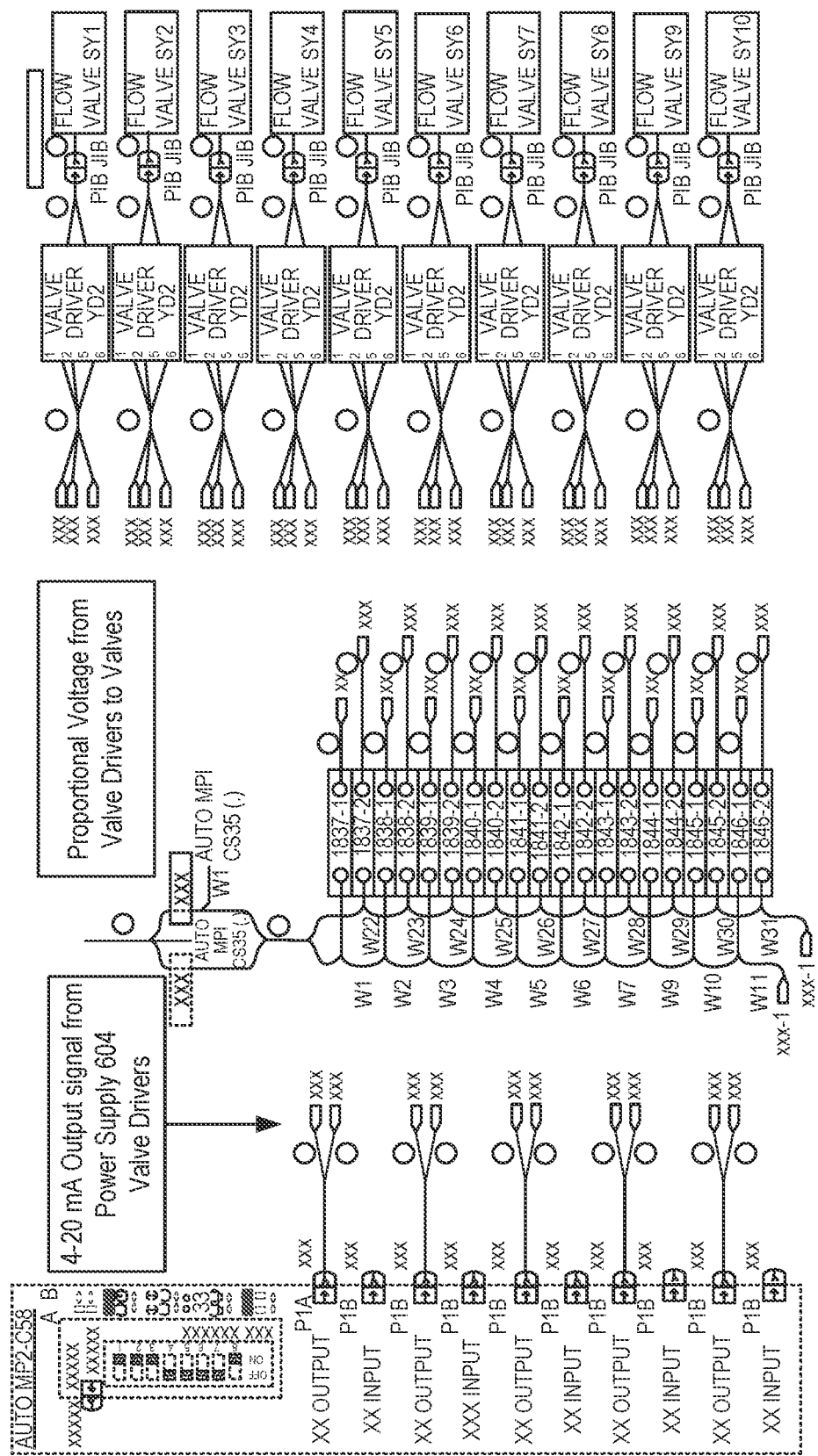
Figure 8:
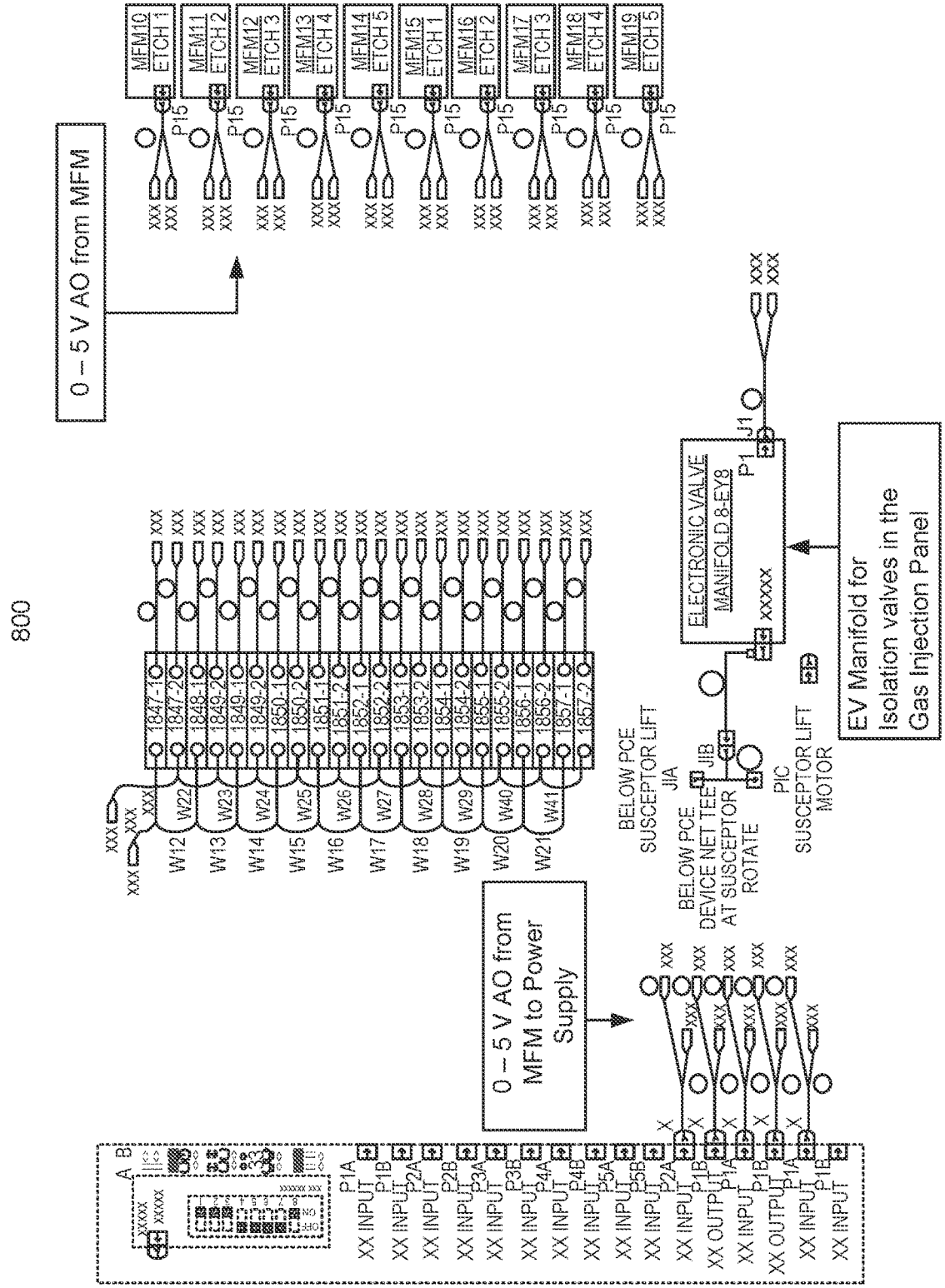

FIG. 6 illustrates an exemplary circuit 600 that can be coupled to controller 318 or form a portion thereof. Circuit 600 can be used to control each valve (e.g., for each of valves 250-268) used to control a flowrate of a gas within a channel. Circuit 600 includes a first power supply 602, a second power supply 604, and a driver 606 coupled to a valve. In the illustrated example, driver 606 converts a signal from power supply 604 or a signal based on a reading from a mass flow meter (shown as input 610) and converts that signal to a proportional voltage to control valve 608. More specifically, power supply 604 can be used to command valve 608 to completely open or complete shut, and power supply 602 can be used to provide the sufficient voltage to do so. FIGS. 7 and 8 illustrate some of the electrical architecture in more detail, illustrating the power supply input to each driver for each of valves 250-268.

Although exemplary embodiments of the present disclosure are set forth herein, it should be appreciated that the disclosure is not so limited. For example, although the gas distribution and reactor systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:
1. A gas distribution system, comprising:
a first gas supply line;
a first gas manifold coupled to the first gas supply line, wherein the first gas manifold comprises a plurality of first gas outlets;
a plurality of first gas flow sensors, wherein at least one of the plurality of first gas flow sensors is coupled to each of the plurality of first gas outlets;
a plurality of first gas valves, wherein at least one of the plurality of first gas valves is coupled to an outlet of each of the plurality of first gas flow sensors;

a first gas pressure-controlled vent line selectively fluidly coupled to an outlet of each of the plurality of first gas valves;
a first pressure transducer configured to measure the pressure within the first gas pressure-controlled vent line;
a second pressure transducer configured to measure a reaction chamber pressure within the reaction chamber;
a vacuum source coupled to the first gas pressure-controlled vent line; and
a controller programmed to operate the vacuum source, during operations of the gas distribution system to provide a first gas via the first gas supply line to the first gas manifold, to maintain a pressure measured by the first pressure transducer in the first gas pressure-controlled vent line within plus or minus ten percent of the reaction chamber pressure within the reaction chamber.

2. The gas distribution system of claim 1, further comprising a plurality of first gas selection valves, wherein an inlet of each of the plurality of first gas selection valves is coupled to an outlet of one of the plurality of first gas valves and the outlet of each of the plurality of first gas selection valves is coupled to an inlet of the first gas pressure-controlled vent line.

3. The gas distribution system of claim 2, wherein the outlet of each of the plurality of first gas selection valves is selectively coupled to the reaction chamber.

4. The gas distribution system of claim 1, further comprising:
a first relief valve configured to allow venting of the first gas manifold;
a moisture sample panel;
an inert gas inlet valve; and
a plurality of channel purge valves.

5. The gas distribution system of claim 1, further comprising a flange, wherein the plurality of first gas valves are fluidly coupled to gas flange channels formed within the flange.

6. The gas distribution system of claim 1, further comprising a proportional-integral-derivative controller coupled to the plurality of first gas valves, wherein the proportional-integral-derivative controller is configured to independently adjust a flow in each of the first gas valves to desired set points.

7. The gas distribution system of claim 1, wherein the plurality of first gas valves comprises at least one of a proportional valve or a solenoid valve.

8. A gas distribution system comprising:
a first gas supply line;
a plurality of first gas outlets coupled to the first gas supply line;
a plurality of first gas valves, wherein at least one of the plurality of first gas valves is coupled to each of the plurality of first gas outlets;
a first gas pressure-controlled vent line selectively fluidly coupled to an outlet of each of the plurality of first gas valves;
a second gas supply line;
a plurality of second gas outlets coupled to the second gas supply line;
a plurality of second gas valves, wherein at least one of the plurality of second gas valves is coupled to each of the plurality of second gas outlets;
a second gas pressure-controlled vent line selectively fluidly coupled to an outlet of each of the plurality of second gas valves;
a first pressure transducer configured to measure the pressure within the first gas pressure-controlled vent line;
a second pressure transducer configured to measure the pressure within the second gas pressure-controlled vent line;
a third pressure transducer configured to measure a reaction chamber pressure within the reaction chamber;
a vacuum source coupled to the first gas pressure-controlled vent line; and
a controller programmed to operate the vacuum source, during operations of the gas distribution system to provide a first gas via the first gas supply line or to provide a second gas via the second gas supply line, to maintain a pressure measured by the first and second pressure transducers in the first and second gas pressure-controlled vent lines within plus or minus ten percent of the reaction chamber pressure within the reaction chamber.

9. The gas distribution system of claim 8, further comprising at least one of:
a plurality of first gas selection valves, wherein an inlet of each of the plurality of first gas selection valves is coupled to an outlet of one of the plurality of first gas valves and the outlet of each of the plurality of first gas selection valves is coupled an inlet of the first gas pressure-controlled vent line; or
a plurality of second gas selection valves, wherein an inlet of each of the plurality of second gas selection valves is coupled to an outlet of one of the plurality of second gas valves and the outlet of each of the plurality of second gas selection valves is coupled to an inlet of the second gas pressure-controlled vent line.

10. The gas distribution system of claim 9, wherein the outlet of each of the plurality of first gas selection valves is selectively coupled to the reaction chamber; and wherein the outlet each of the plurality of second gas selection valves is selectively coupled to the reaction chamber.

11. The gas distribution system of claim 8, further comprising:
a first relief valve configured to allow venting of the first gas supply line;
a second relief valve configured to allow venting of the second gas supply line;
a moisture sample panel;
an inert gas inlet valve; and
a plurality of channel purge valves.

12. The gas distribution system of claim 8, further comprising a flange, wherein the plurality of first gas valves and the plurality of second gas valves are fluidly coupled to gas flange channels formed within the flange.

13. The gas distribution system of claim 8, further comprising a proportional-integral-derivative controller coupled to the plurality of first gas valves and to the plurality of second gas valves, wherein the proportional-integral-derivative controller is configured to independently adjust a flow in each of the first and second gas valves to desired set points.

14. The gas distribution system of claim 8, wherein the plurality of first gas valves comprises at least one of a proportional valve or a solenoid valve.

15. A gas distribution system comprising:
a first gas supply line;
a plurality of first gas outlets coupled to the first gas supply line;

a plurality of first gas valves, wherein at least one of the plurality of first gas valves is coupled to each of the plurality of first gas outlets;

a first gas pressure-controlled vent line selectively fluidly coupled to an outlet of each of the plurality of first gas valves;

a first pressure transducer configured to measure the pressure within the first gas pressure-controlled vent line;

a second pressure transducer configured to measure a reaction chamber pressure within the reaction chamber;

a vacuum source coupled to the first gas pressure-controlled vent line; and a controller programmed to operate the vacuum source, during operations of the gas distribution system to provide a first gas via the first gas supply line, to maintain a pressure measured by the first pressure transducer in the first gas pressure-controlled vent line within plus or minus ten percent of the reaction chamber pressure within the reaction chamber.

16. The gas distribution system of claim 15, further comprising:

a plurality of first gas selection valves, wherein an inlet of each of the plurality of first gas selection valves is coupled to an outlet of one of the plurality of first gas valves and the outlet of each of the plurality of first gas selection valves is coupled an inlet of the first gas pressure-controlled vent line.

17. The gas distribution system of claim 16, wherein the outlet of each of the plurality of first gas selection valves is selectively coupled to the reaction chamber.

18. The gas distribution system of claim 15, further comprising:

a first relief valve configured to allow venting of the first gas supply line;

a moisture sample panel;

an inert gas inlet valve; and a plurality of channel purge valves.

19. The gas distribution system of claim 15, further comprising a flange, wherein the plurality of first gas valves are fluidly coupled to gas flange channels formed within the flange.

20. The gas distribution system of claim 15, further comprising a proportional-integral-derivative controller coupled to the plurality of first gas valves, wherein the proportional-integral-derivative controller is configured to independently adjust a flow in each of the first gas valves to desired set points.

* * * * *